United States Patent
Ino et al.

(10) Patent No.: US 8,207,020 B2
(45) Date of Patent: Jun. 26, 2012

(54) SEMICONDUCTOR DEVICE

(75) Inventors: Yoshihiko Ino, Miyazaki (JP);
Takeharu Suzuki, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/064,603

(22) Filed: Apr. 4, 2011

(65) Prior Publication Data

US 2011/0183468 A1 Jul. 28, 2011

Related U.S. Application Data

(63) Continuation of application No. 12/073,677, filed on Mar. 7, 2008, now Pat. No. 7,939,931.

(30) Foreign Application Priority Data

Mar. 28, 2007 (JP) .................... 2007-085405

(51) Int. Cl.
*H01L 21/00* (2006.01)

(52) U.S. Cl. ........ 438/122; 438/121; 438/125; 438/126; 438/127

(58) Field of Classification Search .............. 438/121, 438/122, 125, 126, 127, FOR. 340, FOR. 369, 438/FOR. 375, FOR. 378

See application file for complete search history.

(56) References Cited

U.S. PATENT DOCUMENTS

| | | | |
|---|---|---|---|
| 2003/0177831 A1* | 9/2003 | Ikezawa et al. | ............ 73/514.16 |
| 2006/0199310 A1* | 9/2006 | Nakabayashi et al. | ........ 438/128 |
| 2007/0205501 A1 | 9/2007 | Lee et al. | |
| 2008/0099240 A1 | 5/2008 | Forgey et al. | |
| 2009/0212407 A1 | 8/2009 | Foster et al. | |

FOREIGN PATENT DOCUMENTS

| | | |
|---|---|---|
| JP | 9292408 | 11/1997 |
| JP | 11289023 | 10/1999 |
| JP | 2000-150695 | 5/2000 |
| JP | 2003163304 | 6/2003 |
| JP | 2004-209585 | 7/2004 |
| JP | 2005069946 | 3/2005 |
| JP | 2005127750 | 5/2005 |
| JP | 2006-41532 | 2/2006 |
| JP | 2007-35847 | 2/2007 |

* cited by examiner

*Primary Examiner* — N Drew Richards
*Assistant Examiner* — Joannie A Garcia
(74) *Attorney, Agent, or Firm* — Rabin & Berdo, P.C.

(57) ABSTRACT

There is provided a semiconductor device whose cost is low and whose case is restrained from breaking. In the semiconductor device having a semiconductor sensor chip, a signal processing circuit for processing signals output from the semiconductor sensor chip and a hollow case for mounting the semiconductor sensor chip and the signal processing circuit therein, the case is constructed by bonding a concave bottom member whose one end is opened with a plate-like lid member that covers the opening of the bottom member. Then, the bottom and lid members are both made of a semiconductor material and are bonded by means of anode bonding or metal bonding for example.

17 Claims, 11 Drawing Sheets

SEMICONDUCTOR DEVICE

This is a Continuation of U.S. application Ser. No. 12/073, 677, filed Mar. 7, 2008, now U.S. Pat. No. 7,939,931 and allowed on Jan. 5, 2011, the subject matter of which is incorporated herein by reference.

CROSS-REFERENCE TO RELATED APPLICATION

This application claims priority under 35 USC 119 from Japanese Patent Application No. 2007-085405, the disclosure of which is incorporated by reference herein.

BACKGROUND OF THE INVENTION

1. Field of the Invention

The present invention relates to a semiconductor device having a semiconductor sensor chip.

2. Description of Related Art

Acceleration and angular velocity sensors (gyroscope) are typically known as semiconductor sensor chips for detecting motions by changes of stress and displacement of a movable portion. It is also known that such semiconductor sensor chips are fabricated through three-dimensional processing implemented on silicon by using a silicon micro-machining technology for example.

Normally, the semiconductor device is constructed by mounting the semiconductor sensor chip within a hollow case so that its sensor section (operating section) is not affected (see Japanese Patent Application Laid-Open Nos. 2003-163304, 9-292408 and 2005-127750, for example).

As typified by the patent documents cited above, the case for mounting the semiconductor sensor chip is constructed as follows for example:

1) construct by members made from ceramics; and 2) a semiconductor chip for processing output signals of the semiconductor sensor chip, i.e., a silicon substrate, is mounted as a part of the case and is combined with a glass member.

However, there have been problems that the case composed of the member made from ceramic is very expensive and that the case constructed by coupling members of different types of materials such as the combination of silicon and glass member is easy to be broken from a difference of their coefficient of expansion.

SUMMARY OF THE INVENTION

The present invention provides a semiconductor device whose cost is low and whose case is restrained from breaking.

According to an aspect of the invention, there is provided a semiconductor device, including:

a hollow case constructed by bonding a first member made of a semiconductor material with a second member made of the semiconductor material;

a semiconductor sensor chip mounted within the case; and a signal processing circuit that is disposed within the case and that processes signals outputted from the semiconductor sensor chip.

It is possible to manufacture the semiconductor device of the invention at low cost while restraining defective bonding and breakage of the case as compared to a case of using ceramic materials by constructing the hollow case for mounting the semiconductor sensor chip and the signal processing circuit therein by the first and second members made of silicon.

Preferably, the signal processing circuit is formed on either one of the first and second members in the semiconductor device of the invention.

Furthermore, one member among the first and second members may be a concave member and another member may be a plate-like member in the semiconductor device of the invention. Still more, the concave member may be constructed by bonding a plate-like member with a frame member.

Preferably, the first and second members are provided with wires and the wire of the first member may be electrically connected with the wire of the second member via a conductive member on a face where the first member is bonded with the second member in the semiconductor device of the invention.

Preferably, an insulating material is applied around the conductive material and part where the first member is bonded with the second material to seal them in the semiconductor device of the invention.

Preferably, a sealing material is applied to seal around the case in the semiconductor device of the invention.

According to the invention, it is possible to provide the semiconductor device whose cost is low and whose case is restrained from breaking.

BRIEF DESCRIPTION OF THE DRAWINGS

Preferred exemplary embodiments of the present invention will be described in detail based on the following figures, wherein.

DETAILED DESCRIPTION OF THE INVENTION

Figure 1:
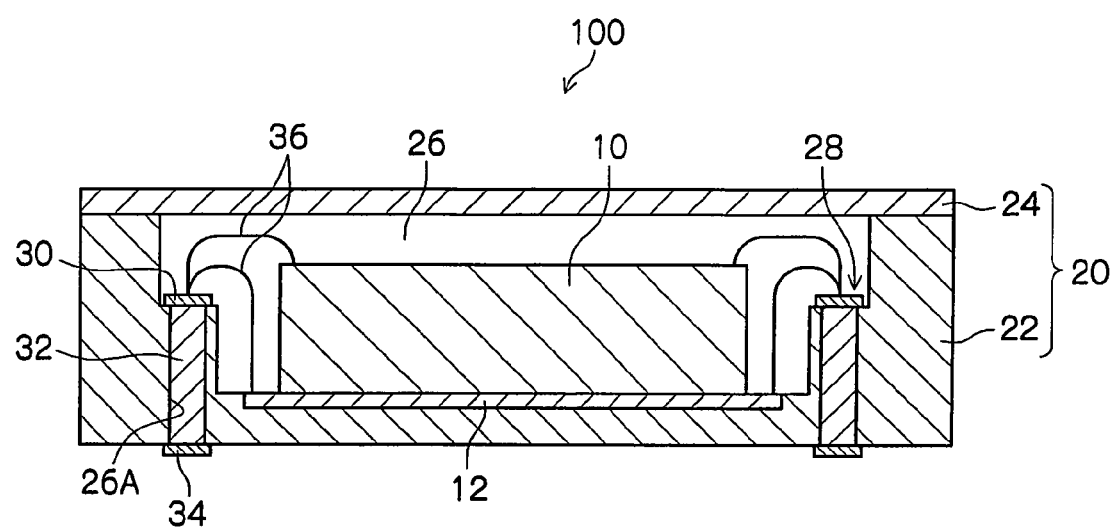
FIG. 1 is a schematic section view showing a semiconductor device of a first embodiment of the invention.

Exemplary embodiments of the invention will be explained below with reference to the drawings. It is noted that members having substantially the same function are denoted by the same reference numerals throughout the drawings and an overlapped explanation thereof may be omitted.
(First Embodiment)

FIG. 1 is a schematic section view showing a semiconductor device of a first embodiment of the invention.

As shown in FIG. 1, the semiconductor device 100 of the first embodiment includes a semiconductor sensor chip 10, a signal processing circuit 12 for processing a signal outputted from the semiconductor sensor chip 10 and a hollow case 20 for mounting the semiconductor sensor chip 10 and the signal processing circuit 12 therein.

The semiconductor sensor chip 10 may be an acceleration sensor, an angular velocity sensor (gyroscope), a resonator (filter), a relay or the like. These may be fabricated by implementing three-dimensional processing on silicon by using the silicon micro-machining technology.

The signal processing circuit 12 is a circuit for processing signals outputted from the semiconductor sensor chip 10 and is configured by integrating an amplifying circuit for amplifying the output signals, a temperature compensating circuit for compensating temperature characteristics of sensitivity and voltage, a noise removing circuit for removing noise and the like.

The case 20 is constructed by a concave bottom member 22 having a concave portion 26 whose one end is opened and a plate-like lid member 24 that covers the opening of the bottom member 22. They are made of silicon and are bonded by means of anode bonding or metal bonding.

The concave portion 26 of the bottom member 22 has a stepped portion 28 so that a diameter of the opening is widened more than that of the bottom. A terminal 30 for electrically connecting to the outside, a through wire 32 which is electrically connected with the terminal 30 and penetrates through the bottom member 22 in a thickness direction from the stepped portion 28, and an external terminal 34 which is disposed on the back of the bottom member 22 and is electrically connected with the through wire 32 are disposed on the stepped portion 28. These through wires 32 and others are disposed at predetermined intervals along four sides of the semiconductor sensor chip 10 mounted in the case.

The signal processing circuit 12 is formed in a bottom of the bottom member 22 made of silicon and is integrated by means of semiconductor processing such as ion-implantation, lithography, etching and others. In addition, the bottom member 22 is provided with the semiconductor sensor chip 10 mounted on the bottom on which the signal processing circuit 12 has been formed. The semiconductor sensor chip 10 and the signal processing circuit 12 are electrically connected with the terminal 30 connected with the through wire 32, respectively, by wires 36.

Next, an exemplary manufacturing method of the semiconductor device 100 of the present embodiment will be described. FIGS. 2A-2E and FIGS. 3A-3E show manufacturing steps of the semiconductor device of the first embodiment. It is noted that FIGS. 2A-2E are perspective views showing the manufacturing steps of the semiconductor device and FIGS. 3A-3E are section views showing the manufacturing steps of the semiconductor device.

Figure 2A:
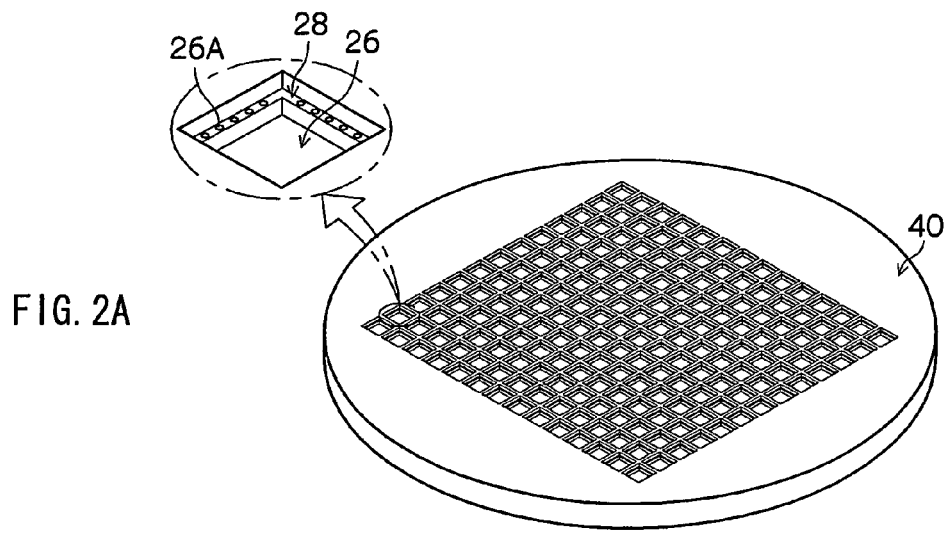
FIG. 2A is a perspective view showing a manufacturing step of the semiconductor device of the first embodiment.
Figure 3A:
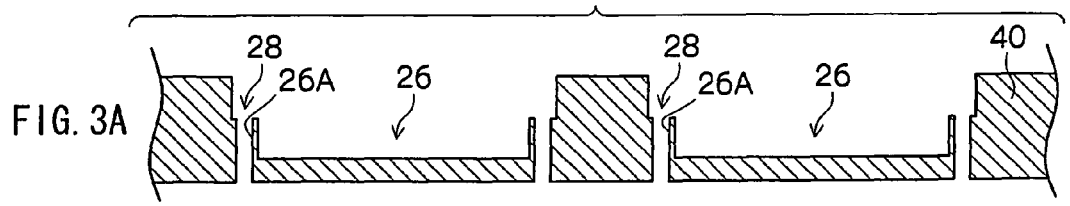
FIG. 3A is a section view showing the manufacturing step of the semiconductor device of the first embodiment.

According to the manufacturing method of the semiconductor device 100 of the present embodiment, a silicon wafer 40 for the bottom members is prepared at first and a large number of chips corresponding to the bottom member 22 is formed thereon as shown in FIGS. 2A and 3A. Specifically, the large number of concave portions 26 of the bottom members 22 is formed by means of the three-dimensional processing implemented by using the silicon micro-machining technology for example. Here, through holes 26A, through which the through wires are embedded, are also formed.

Figure 2B:
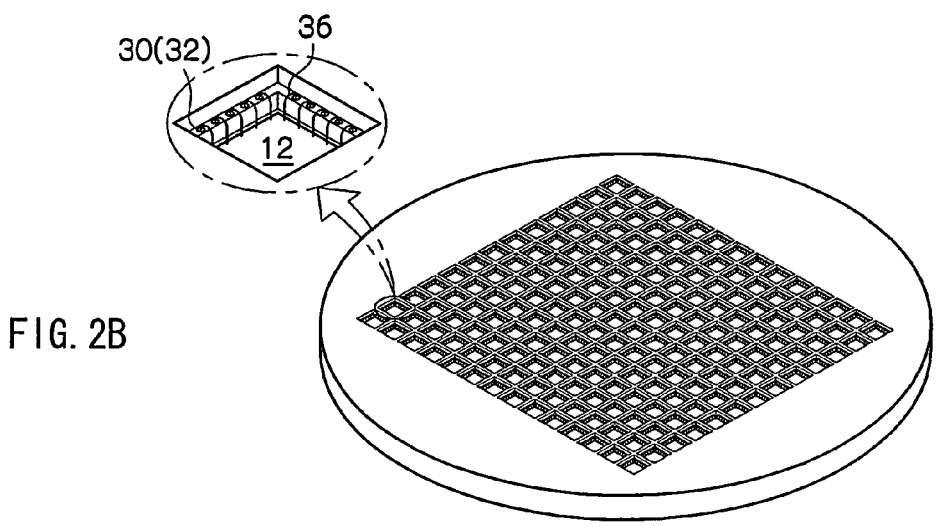
FIG. 2B is a perspective view showing the manufacturing step of the semiconductor device of the first embodiment.
Figure 3B:
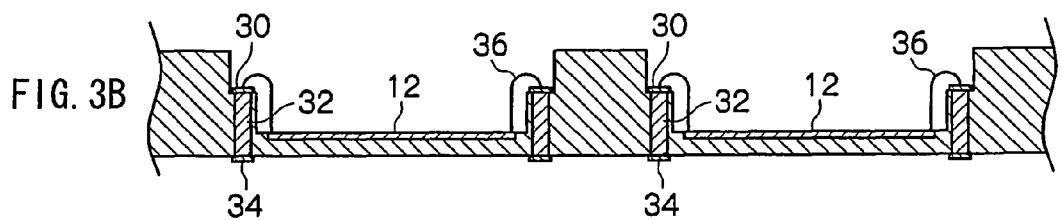
FIG. 3B is a section view showing the manufacturing step of the semiconductor device of the first embodiment.

Next, the signal processing circuit 12 is formed in the bottom face of the concave portion 26 of each of the bottom member 22 by the semiconductor processing as shown in FIGS. 2B and 3B. Successively, a through wire is embedded to each through hole 26 a bottom member 22 by means of plating for example and the terminal 30 and an external terminal 34 that are connected to the both ends of the through wire are formed. Then, the signal processing circuit 12 is electrically connected with the terminal 30 provided at one end of the through wire 32 by a wire 36 by carrying out wire-bonding.

Figure 2C:
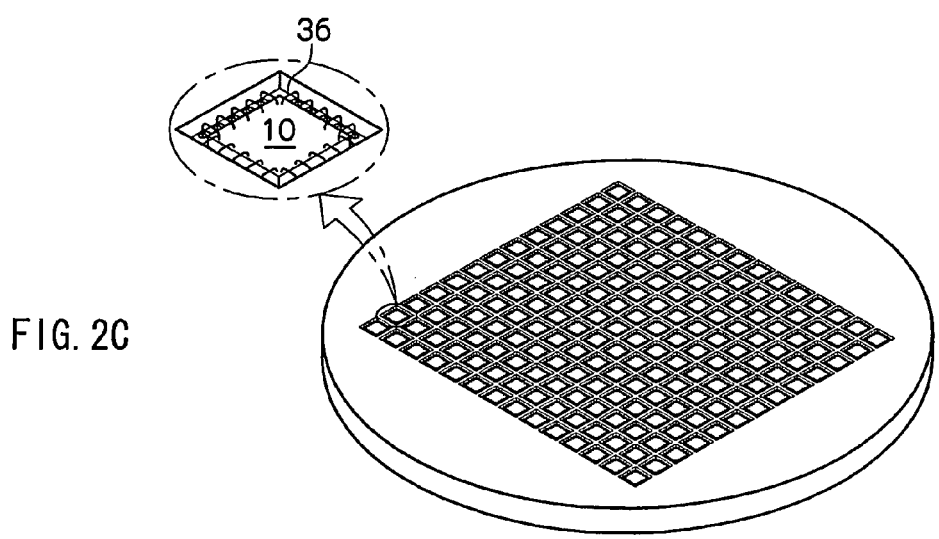
FIG. 2C is a perspective view showing the manufacturing step of the semiconductor device of the first embodiment.
Figure 3C:
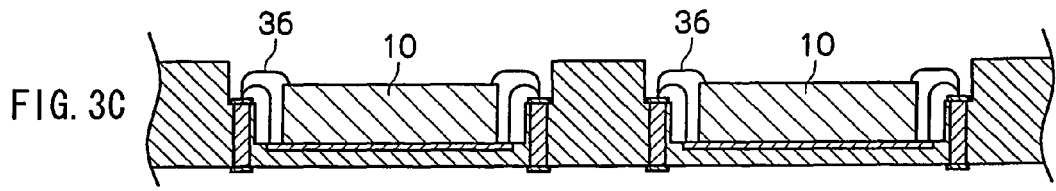
FIG. 3C is a section view showing the manufacturing step of the semiconductor device of the first embodiment.

Next, the semiconductor sensor chip 10 is mounted on the bottom of each bottom member 22 on which the signal processing circuit 12 has been formed as shown in FIGS. 2C and 3C. Then, the semiconductor sensor chip 10 is electrically connected with the terminal 30 provided at one end of the through wire 32 by the wire 36 by carrying out wire-bonding.

Figure 2D:
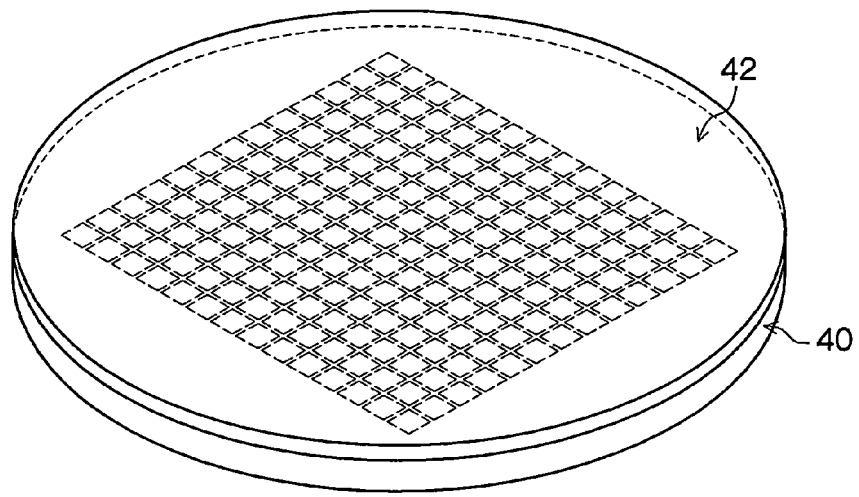
FIG. 2D is a perspective view showing the manufacturing step of the semiconductor device of the first embodiment.
Figure 3D:
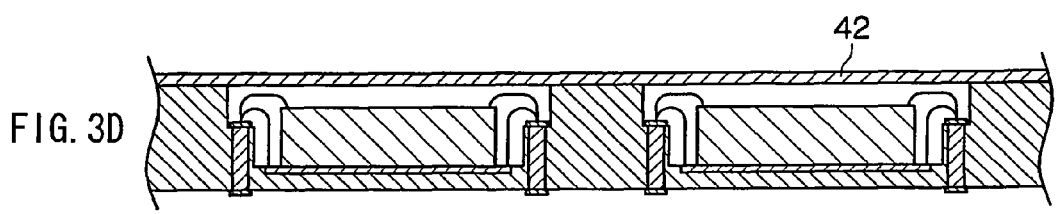
FIG. 3D is a section view showing the manufacturing step of the semiconductor device of the first embodiment.

Next, a silicon wafer 42, which has the same diameter with the silicon wafer 40 and composes the lid member 24, is superimposed on and bonded with the silicon wafer 40 in which the concave portions 26 of the bottom members 22 have been formed by means of anode bonding or metal bonding as shown in FIGS. 2D and 3D.

Figure 2E:
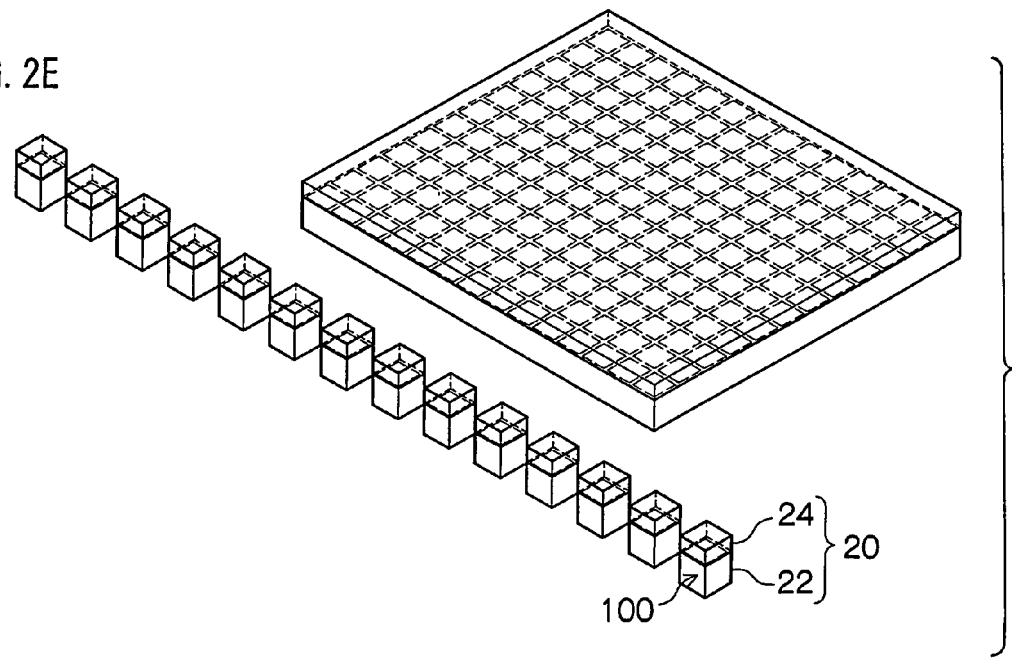
FIG. 2E is a perspective view showing the manufacturing step of the semiconductor device of the first embodiment.
Figure 3E:
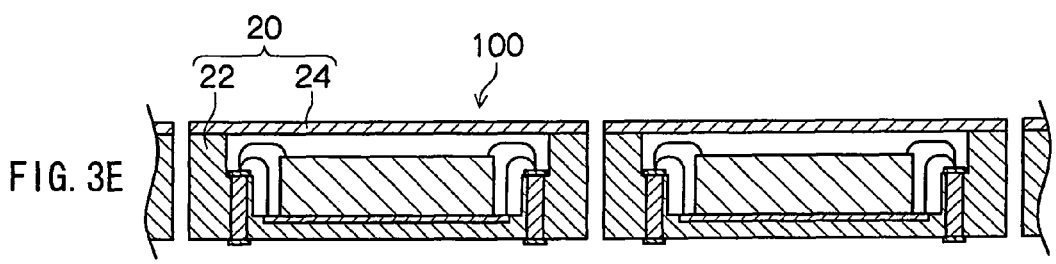
FIG. 3E is a section view showing the manufacturing step of the semiconductor device of the first embodiment.

Then, the two bonded silicon wafers are cut into individual pieces by means of a dicing saw or the like as shown in FIGS. 2E and 3E.

Through the above processes, the semiconductor device 100 is obtained.

In the semiconductor device 100 of the present embodiment described above, the hollow case 20 mounting the semiconductor sensor chip 10 and the signal processing circuit 12 is constructed by bonding the bottom member 22 with the lid member 24, both made of silicon. Therefore, manufacturing costs are lower compared with when using a ceramic material. In addition, because the hollow case 20 is constructed by bonding members made of silicon, it is possible to reduce the occurrence of defective bonding and breakage of the hollow case 20 caused by a difference in coefficients of expansion. Still more, because strain between the members of the case 20 which may be caused by heat is reduced, it becomes possible to reduce the influence thereof on the semiconductor sensor chip, and to conduct measurements with improved sensitivity.

Because the members composing the case 20 (the bottom member in the present embodiment) are made of silicon in the semiconductor device 100 of the present embodiment, the signal processing circuit 12 is formed by directly integrating on the members through the semiconductor processing. Therefore, it is not necessary to provide a separate semiconductor chip for the signal processing circuit. This allows the thickness of the semiconductor device itself to be reduced, the chip mounting area to be reduced and space-saving to be realized.

Figure 4:
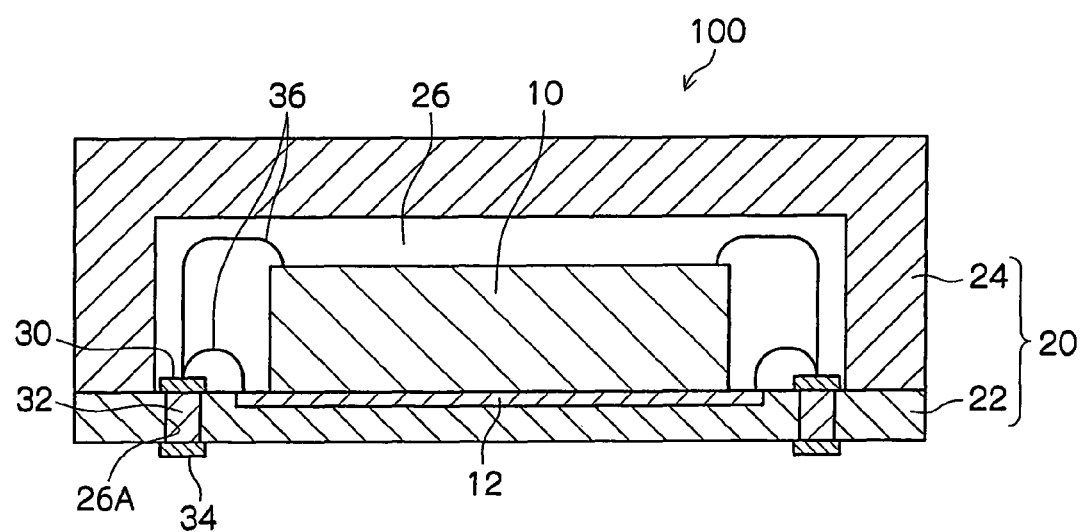
FIG. 4 is a schematic section view showing another semiconductor device of the first embodiment.

It is noted that the mode of forming the case 20 by bonding the concave bottom member 22 with the plate-like lid member 24 has been explained in the present embodiment, the present invention is not limited to such mode and may adopt another mode of forming the case 20 by bonding a plate-like bottom member 22 with a concave lid member 24 as shown in FIG. 4 for example.

(Second Embodiment)

Figure 5:
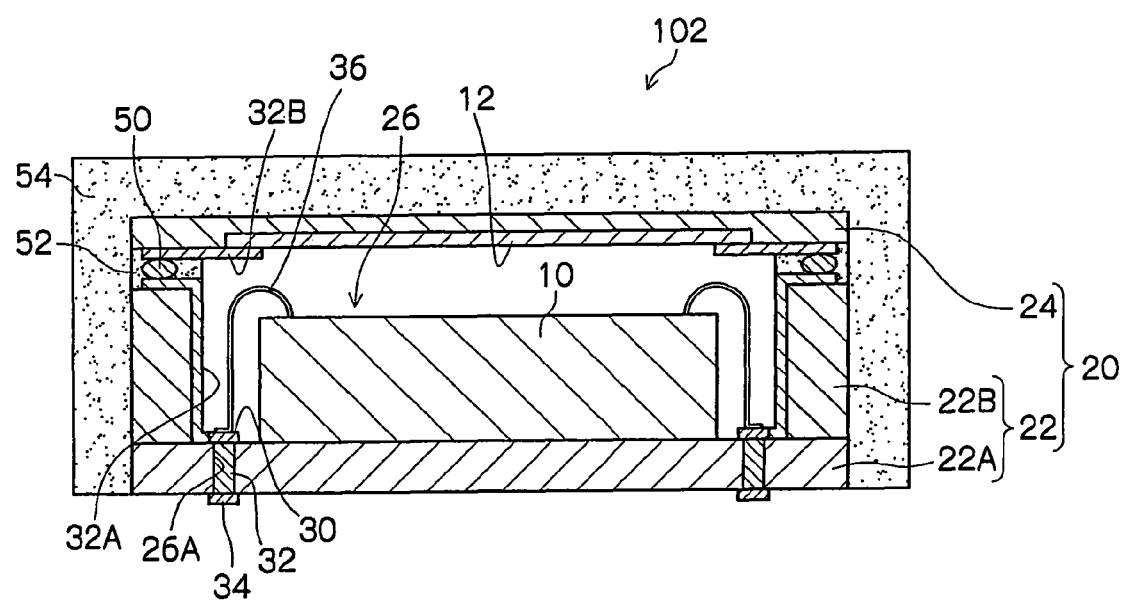
FIG. 5 is a schematic section view showing a semiconductor device of a second embodiment of the invention.

FIG. 5 is a schematic section view showing a semiconductor device of a second embodiment of the invention.

The semiconductor device 102 of the second embodiment has the semiconductor sensor chip 10, the signal processing circuit 12 for processing a signal outputted from the semiconductor sensor chip 10 and the hollow case 20 for mounting the semiconductor sensor chip 10 and the signal processing circuit 12 therein.

The semiconductor sensor chip 10 may be an acceleration sensor, an angular velocity sensor (gyroscope), a resonator (filter), and a relay or the like. These may be fabricated by implementing three-dimensional processing on silicon by using the silicon micro-machining technology for example.

The signal processing circuit 12 is a circuit for processing output signals outputted from the semiconductor sensor chip 10 and is configured by integrating an amplifying circuit for amplifying the output signals, a temperature compensating circuit for compensating temperature characteristics of sensitivity and voltage, a noise removing circuit for removing noise, and the like.

The case 20 is constructed by bonding a concave bottom member 22 having a concave portion 26 whose one end is opened with a plate-like lid member 24 that covers the opening of the bottom member 22. The bottom member 22 and the lid member 24 are both made of silicon.

The bottom member 22 is constructed by bonding a plate-like member 22A with a frame member 22B, thus forming the concave portion 26. The plate-like member 22A is bonded with the frame member 22B by means of anode bonding or metal bonding for example.

The plate-like member 22A is provided with the terminal 30 for external electrical connection, the through wire 32 which is electrically connected with the terminal 30 and penetrates through the plate-like member 22A in a thickness direction, and the external terminal 34 which is disposed on the back of the plate-like member 22A and is electrically connected with the through wire 32.

Meanwhile, the frame member 22B is provided with a wire 32A that is connected with the terminal 30 of the plate-like member 22A and is formed so as to extend from the terminal 30 along an inner wall face of the frame member 22B to an end face (on the opposite side from a face bonded with the plate-like member 22A). These wires 32A and the through holes 32 are disposed at predetermined intervals along four sides of the semiconductor sensor chip 10 mounted in the case 20.

Then, the semiconductor sensor chip 10 is mounted on the bottom face of the bottom member 22 (bottom face of the plate-like member 22A) and is electrically connected with the terminal 30, which is connected with the through wire 32 by the wire 36.

Because the lid member 24 is made of silicon, the signal processing circuit 12 is formed in the face thereof (the face opposing to the bottom member 22) while being integrated by means of the semiconductor processing such as ion-implantation, lithography, etching and others.

Wires 32B electrically connected with the signal processing circuit 12, which is formed in the lid member 24, are formed radially from the signal processing circuit 12 toward the four sides of the lid member 24. It is noted that the wires electrically connected with the signal processing circuit 12 are disposed at predetermined intervals along the four sides of the lid member 24.

Here, the bottom member 22 and the lid member 24 are arranged such that an end of the wire 32A is electrically bonded with an end of the wire 32B through a conductive material 50, e.g., an Au bump or the like, at the end face of the flame member 22B of the bottom member 22 and the edge of the lid member 24. Further, an insulating material 52, e.g. insulating paste, is applied around the conductive material 50 and around the ends of the wires 32A and 32B to seal and bond them.

Then, a sealing material 54 is applied to seal around the case 20 constructed by bonding the bottom member 22 with the lid member 24.

It is noted that although the mode in which the wires 32A and 32B are formed on the surface of the respective members has been explained, they may be formed within the respective members by forming holes or grooves in the members and by embedding the wires therein.

Next, an exemplary manufacturing method of the semiconductor device 102 of the present embodiment will be described. Here, FIGS. 6A-6E and FIGS. 7A-7E show manufacturing steps of the semiconductor device of the second embodiment. It is noted that FIGS. 6A-6E are perspective views showing the manufacturing steps of the semiconductor device and FIGS. 7A-7E are section views showing the manufacturing steps of the semiconductor device.

Figure 6A:
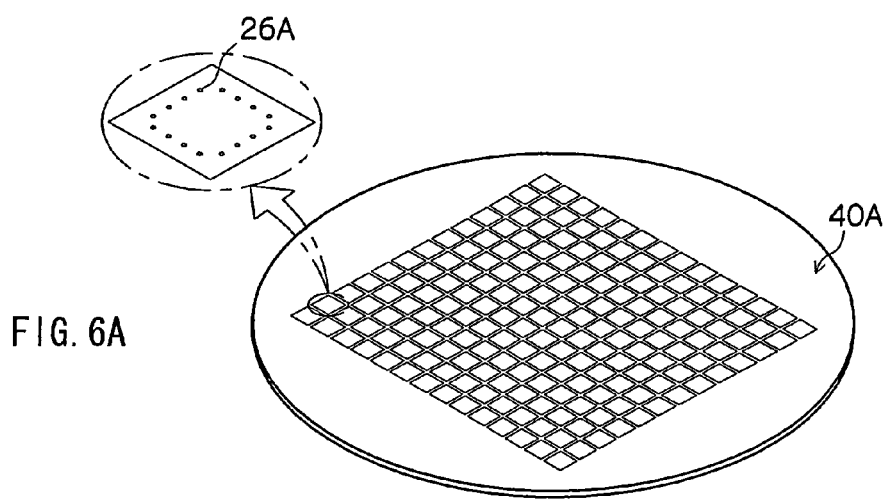
FIG. 6A is a perspective view showing a manufacturing step of the semiconductor device of the second embodiment.
Figure 7A:
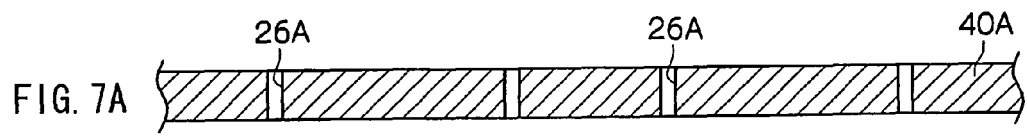
FIG. 7A is a section view showing the manufacturing step of the semiconductor device of the second embodiment.

According to the manufacturing method of the semiconductor device 102 of the present embodiment, a silicon wafer 40A for the plate-like member is prepared at first and a large number of chips corresponding to the plate-like members 22A of the bottom member 22 is formed thereon as shown in FIGS. 6A and 7A. Specifically, through holes 26A, through which the through wires 32 are embedded, are formed in the plate-like member 22A of the bottom member 22 by implementing the three-dimensional processing by using the silicon micro-machining technology for example.

Figure 6B:
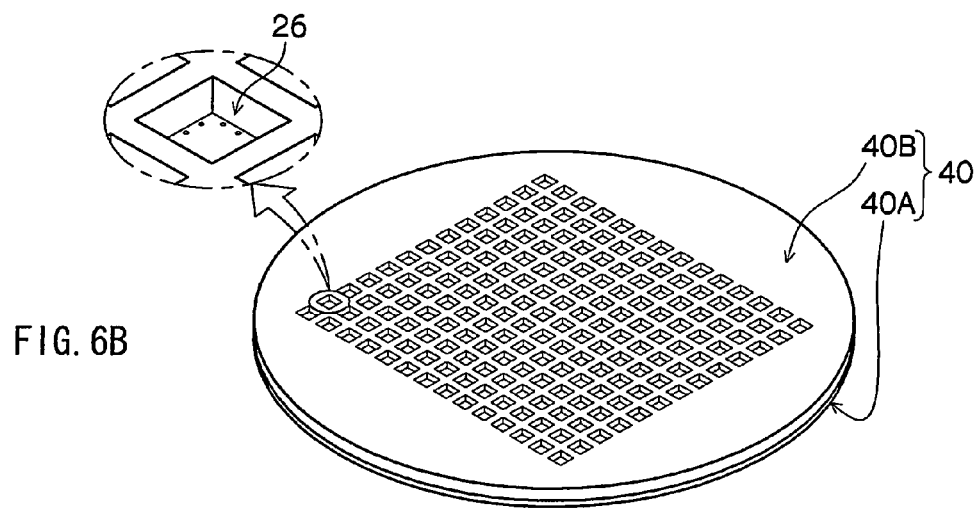
FIG. 6B is a perspective view showing the manufacturing step of the semiconductor device of the second embodiment.
Figure 7B:
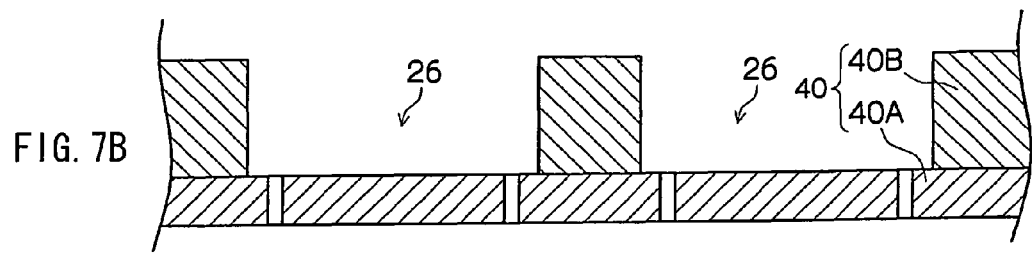
FIG. 7B is a section view showing the manufacturing step of the semiconductor device of the second embodiment.

Next, a silicon wafer 40B for the frame member having the same diameter with the silicon wafer 40A for the plate-like member is prepared and a large number of chips corresponding to the frame members 22B of the bottom member 22 is formed thereon as shown in FIGS. 6B and 7B. Specifically, openings for forming the frame member 22B of the bottom member 22 are formed by implementing the three-dimensional processing by using the silicon micro-machining technology for example. Then, the silicon wafer 42B for the lid member is superimposed on and bonded with the silicon wafer 40A for the plate-like member by means of anode bonding or metal bonding for example. A silicon wafer 40 for the bottom member, in which a large number of bottom members 22 having the concave portions 26 is formed, is formed by bonding the two silicon wafers as described above. Here, the concave portions and through holes may be formed within a single silicon wafer as shown in FIGS. 2A and 3A of the first embodiment instead of the steps up to FIGS. 6B and 7B.

Figure 6C:
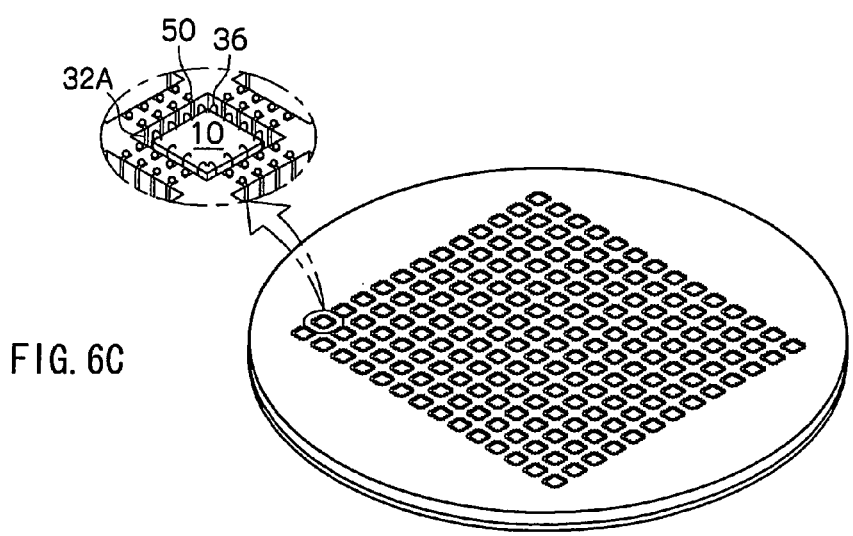
FIG. 6C is a perspective view showing the manufacturing step of the semiconductor device of the second embodiment.
Figure 7C:
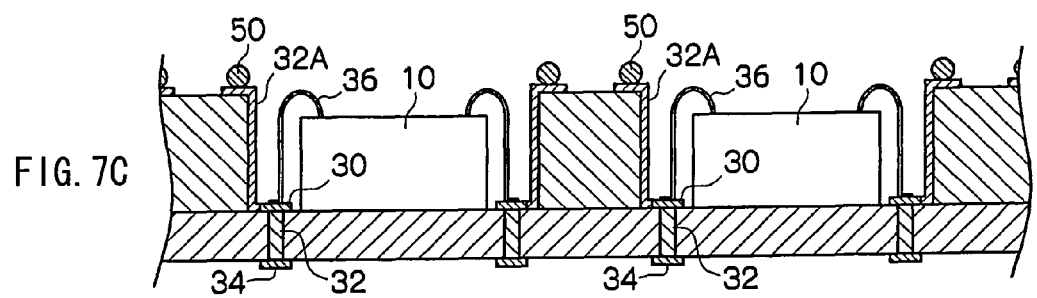
FIG. 7C is a section view showing the manufacturing step of the semiconductor device of the second embodiment.

Next, as seen in FIGS. 6C and 7C, the through wire 32 is embedded at the through hole 26A of each of the bottom members 22 formed in the silicon wafer 40 by means of plating and the like and the terminal 30 and the external terminal 34 are formed so as to be connected respectively to both ends of the through wire 32. In addition, the wire 32A, which is connected with the terminal 30 of the plate-like member 22A and extends from the terminal 30 to the end face of the frame member 22B (the end face on the opposite side to the face bonded with the plate-like member 22A) via an inner wall face of the frame member 22B, is formed on each of the bottom members 22. Here, the conductive material 50, e.g., the Au bump and the like, is formed at the end of the wire 32A.

Then, the semiconductor sensor chip 10 provided on the bottom face of each of the bottom members 22 (on the surface of the plate-like member 22A) is electrically connected with the terminal 30 provided at one end of the through wire 32 by the wire 36 by carrying out wire-bonding.

Figure 6D:
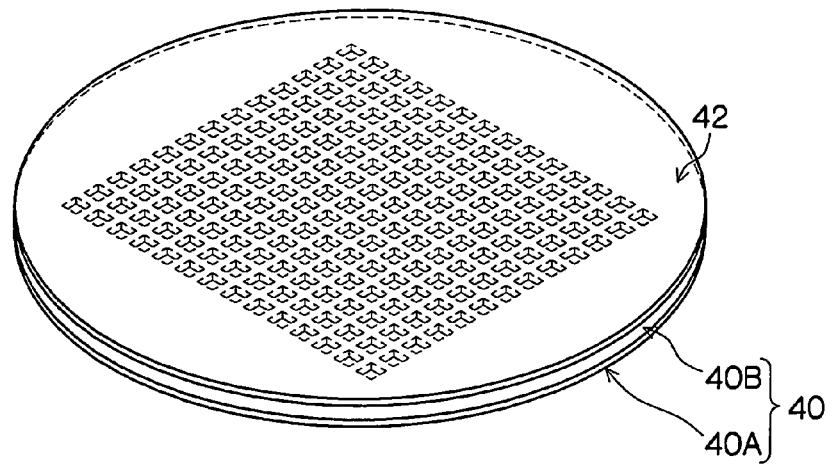
FIG. 6D is a perspective view showing the manufacturing step of the semiconductor device of the second embodiment.
Figure 7D:
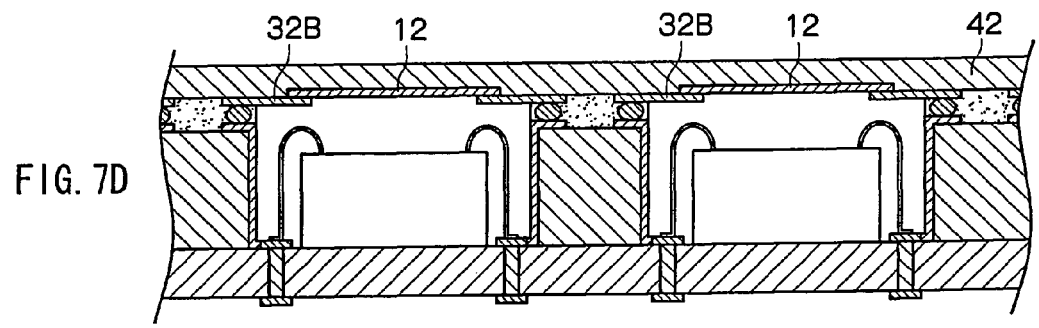
FIG. 7D is a section view showing the manufacturing step of the semiconductor device of the second embodiment.

Next, the silicon wafer 42 for the lid member that has the same diameter with the silicon wafer 40 for the bottom member is prepared and a large number of chips corresponding to the lid members 24 is formed. The silicon wafer 42 is then superimposed on and bonded with the silicon wafer 40 for the bottom member as shown in FIGS. 6D and 7D. It is noted that the signal processing circuit 12 is formed on a region corresponding to each lid member of the silicon wafer 42 by means of the semiconductor processing and the wire 32B electrically connected with the signal processing circuit 12 is formed radially from the signal processing circuit 12 to each of the four sides of the lid member 24 by plating or the like.

Here, before superimposing the silicon wafer 40 for the bottom member with the silicon wafer 42, the insulating material, e.g., the insulating paste, is applied to the silicon wafer 40 for the bottom member so as to cover around the conductive material 50 and the end of the wire 32A. However, the insulating material 52 is applied so as to expose an apex (a top surface) of the conductive material 50. Then, the end of the wire 32A may be electrically connected with that of the wire 32B via the conductive material 50, e.g., the Au bump or the like, at the end face of the frame member 22B of the bottom member 22 and the edge of the lid member 24 and the part around the conductive material 50 and the ends of the wires 32A and 32B may be sealed and bonded by the insulating material, e.g. the insulating paste, by superimposing the silicon wafer 40 with the silicon wafer 42, by heating them at predetermined temperature and by curing the insulating material.

Figure 6E:
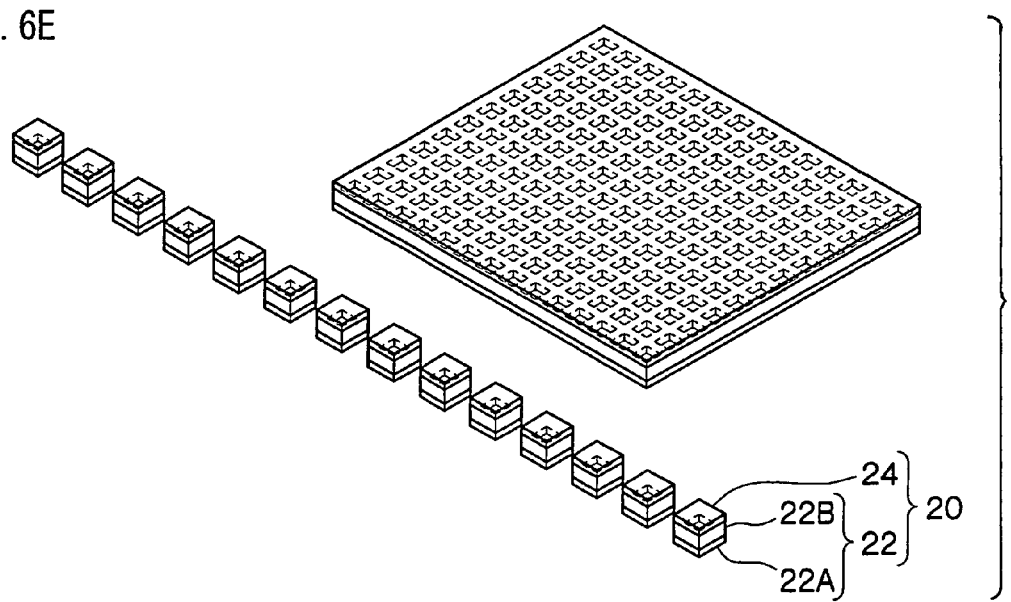
FIG. 6E is a perspective view showing the manufacturing step of the semiconductor device of the second embodiment.
Figure 7E:
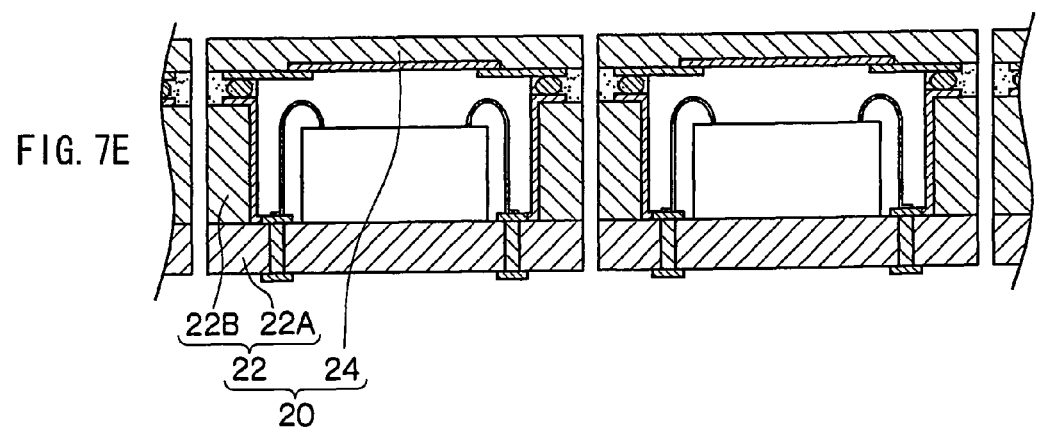
FIG. 7E is a section view showing the manufacturing step of the semiconductor device of the second embodiment.

Next, the two bonded silicon wafers are cut into individual pieces by means of a dicing saw or the like as shown in FIGS. 6E and 7E. After that, the sealing material 54 is applied to seal around the individualized case 20 although not shown.

It becomes possible to obtain the semiconductor device 102 through the processes described above.

While the wires 32A and 32B formed respectively on the bottom member 22 and the lid member 24 are electrically connected via the conductive material 50 in the semiconductor device 102 of the present embodiment described above, it is possible to restrain defective connection of the wires 32A and 32B because the bottom member 22 and the lid member 24 are both made of silicon and a strain which is otherwise caused by a difference of coefficient of expansion occurs less.

Furthermore, because the wire 32A and 32B formed respectively on the bottom member 22 and the lid member 24 are electrically connected and the bottom member 22 is bonded with the lid member 24 while sealing around the conductive material 50 in the semiconductor device 102 of the present embodiment, it is possible to restrain defective bonding of the bottom member 22 with the lid member 24 and also to restrain defective connection of the wire 32A with the wire 32B.

In addition, because the insulating material 52 seals around the conductive material 50, i.e., around the part where the bottom member 22 is bonded with the lid member 24, it is possible to prevent the sealing material 54 from flowing into the case 20 from the bonding part and to prevent the sealing material 54 from contacting with the semiconductor sensor chip 10 in sealing around the case 20 by the sealing material 54. As a result, it is possible to restrain the semiconductor sensor chip 10 from causing defective operation.

Because the semiconductor device 102 of the present embodiment is the same with the first embodiment other than those described above, its explanation will be omitted here.

Figure 8:
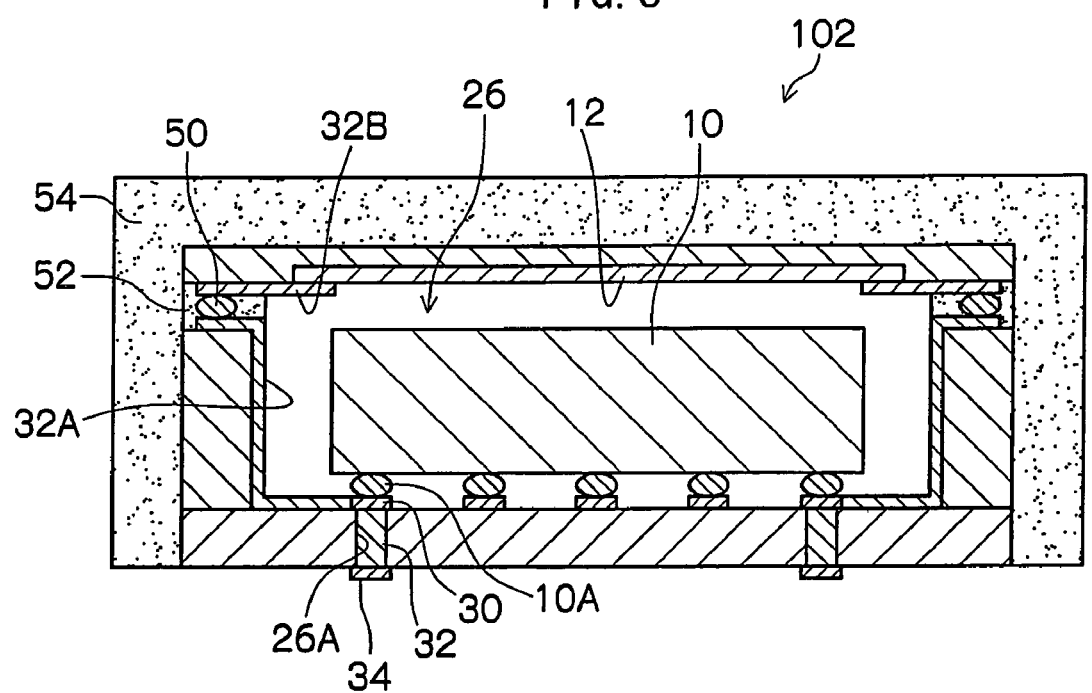
FIG. 8 is a schematic section view showing another semiconductor device of the second embodiment.
Figure 9:
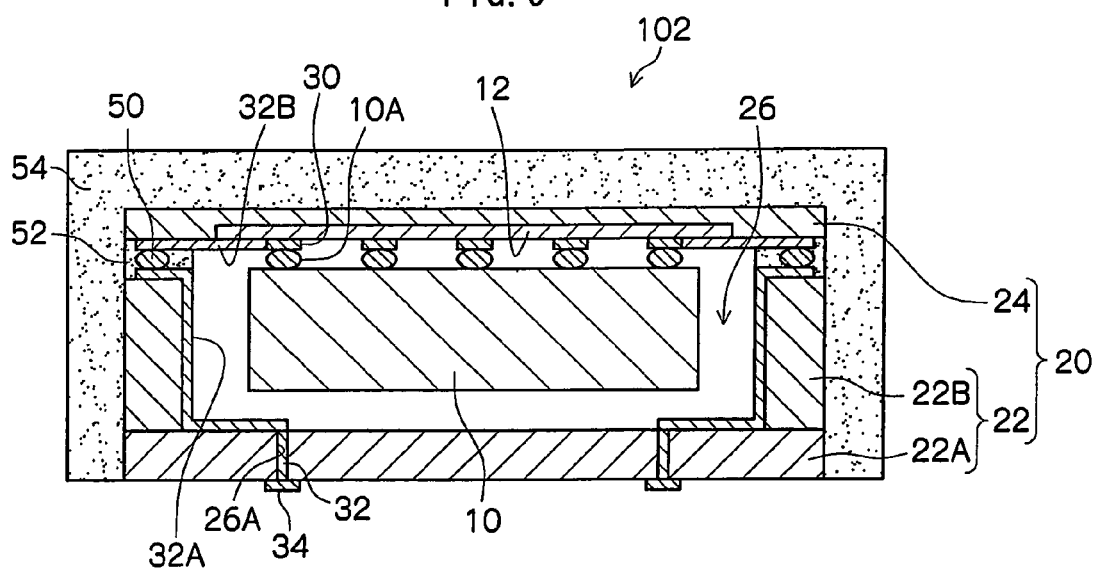
FIG. 9 is a schematic section view showing another semiconductor device of the second embodiment

It is noted that the mode of realizing the electrical connection of the semiconductor sensor chip 10 by the wire 36 has been explained, the invention is not limited to that and it is possible to adopt a mode of realizing the electrical connection via bumps 10A, e.g., Au bumps and the like, provided at the bottom face of the semiconductor sensor chip 10 for example as shown in FIG. 8. Still more, the mode of mounting the semiconductor sensor chip 10 on the bottom face of the bottom member 22 has been explained in the present embodiment, the invention is not also limited to that and it is possible to adopt a mode of mounting the semiconductor sensor chip 10 on the surface of the lid member 24 as shown in FIG. 9. It is noted that the electrical connection is made via the bumps 10A, e.g., the Au bumps and the like, provided on the surface of the semiconductor sensor chip 10 also in the mode shown in FIG. 9.

Furthermore, while the mode of constructing the bottom member 22 and the lid member 24 of the case 20 by silicon has been explained in the present embodiment, the invention is not limited to that and another semiconductor material may be applicable as well.

It is then needless to say that any of the embodiments and modes described above should not be construed as definitive and the invention may be realized within the scope meeting with the requirements of the invention described below.

What is claimed is:

1. A method of fabricating a semiconductor device, comprising:
    preparing a first semiconductor wafer;
    forming a concave portion in the first semiconductor wafer;
    disposing a signal processing circuit in the concave portion;
    mounting a semiconductor sensor chip on the signal processing circuit;
    connecting a second semiconductor wafer that is a plate-lie member and that covers the concave portion to the first semiconductor wafer, said connecting includes bonding the second semiconductor wafer to the first semiconductor wafer to form a hollow case, the semiconductor sensor chip being mounted within the hollow case, the signal processing circuit being formed in a bottom of the concave portion and under the semiconductor sensor chip, the semiconductor sensor chip being supported on the signal processing circuit and being free of direct contact with the plate-like member; and
    cutting the first semiconductor wafer and the second semiconductor wafer into individual pieces.

2. The method recited in claim 1 , wherein the signal processing circuit processes signals output from the semiconductor sensor chip.

3. The method recited in claim 1, further comprising applying an insulating material to seal around a portion where the first semiconductor wafer is bonded with the second semiconductor wafer.

4. The method recited in claim 1, further comprising applying a sealing material to seal around the hollow case.

5. The method recited in claim 1, wherein the first and second semiconductor wafers are made of the same semiconductor material.

6. The method recited in claim 5, wherein the same semiconductor material is silicon.

7. The method recited in claim 1, wherein the concave portion is comprised of silicon.

8. The method recited in claim 7, wherein the signal processing circuit is directly integrated within the concave portion.

9. The method recited in claim 8, wherein the signal processing circuit is formed by one of ion-implantation, lithography, and etching of the concave portion.

10. The method recited in claim 1, wherein an upper surface of the signal processing circuit is substantially coplanar with a bottom of the concave portion.

11. The method recited in claim 1, wherein a bottom of the concave portion defines an upper surface of the signal processing circuit.

12. The method recited in claim 1, wherein the second semiconductor wafer is bonded to the first semiconductor wafer using anode bonding or metal bonding.

13. The method recited in claim 1, wherein the concave portion is formed by three-dimensional processing.

14. The method recited in claim 13, wherein the three-dimensional processing is implemented by using silicon micro-machining technology.

15. The method recited in claim 1, wherein said forming a concave portion includes forming a plurality of concave portions in the first semiconductor wafer, with each concave portion having a respective signal processing circuit disposed therein.

16. The method recited in claim 15, wherein said mounting a semiconductor sensor chip includes mounting a plurality of semiconductor sensor chips, with each signal processing circuit having a respective semiconductor sensor chip thereon.

17. A method of fabricating a semiconductor device, comprising:
   preparing a first semiconductor wafer;
   forming a plurality of concave portions in the first semiconductor wafer;
   disposing a signal processing circuit in each concave portion, so that each concave portion has a respective signal processing circuit disposed therein;
   mounting a semiconductor sensor chip on a respective signal processing circuit, each signal processing circuit being formed in a bottom of respective concave portion and under a respective semiconductor sensor chip, the respective semiconductor sensor chips being supported on a corresponding signal processing circuit and being free of direct contact with the second semiconductor wafer;
   connecting a second semiconductor wafer that covers the concave portion to the first semiconductor wafer; and
   cutting the first semiconductor wafer and the second semiconductor wafer into individual pieces.

* * * * *